United States Patent [19]

Tsujimura et al.

[11] Patent Number: 5,626,796
[45] Date of Patent: May 6, 1997

[54] LIGHT SENSITIVE COMPOSITION FOR BLACK MATRIX, SUBSTRATE FOR COLOR FILTER, AND LIQUID CRYSTAL DISPLAY

[75] Inventors: Naoyuki Tsujimura; Toshihiro Ueki, both of Kawasaki; Akira Ushimaru; Kesanao Kobayashi, both of Shizuoka-Ken, all of Japan

[73] Assignees: Fuji Photo Film Co., Ltd., Kanagawa, Japan; International Business Machines Corporation, Armonk, N.Y.

[21] Appl. No.: 385,884

[22] Filed: Feb. 9, 1995

[30] Foreign Application Priority Data

Mar. 18, 1994 [JP] Japan .......................... 6-048888

[51] Int. Cl.⁶ .......................... F21V 9/00; G02F 1/1335
[52] U.S. Cl. .......................... 252/582; 349/106
[58] Field of Search .......................... 252/299.01, 299.5, 252/582; 428/1; 359/67, 68

[56] References Cited

U.S. PATENT DOCUMENTS

| | | | |
|---|---|---|---|
| 4,934,791 | 6/1990 | Shimizu et al. | 252/582 |
| 5,085,973 | 2/1992 | Shimizu et al. | 359/68 |
| 5,121,237 | 6/1992 | Ikeda et al. | 359/67 |
| 5,225,307 | 7/1993 | Hor et al. | 430/136 |
| 5,403,692 | 4/1995 | Yokokawa et al. | 430/135 |

*Primary Examiner*—Shean C. Wu
*Attorney, Agent, or Firm*—Sughrue, Mion, Zinn, Macpeak & Seas

[57] ABSTRACT

A light-sensitive composition for forming a black matrix comprises (a) a photopolymerizable unsaturated compound, (b) a photopolymerization initiator, (c) a binder and (d) a pigment, wherein the amount of monovalent metallic cations present in the pigment as impurities is not more than 5 ppm; a black matrix is formed from the composition; a color filter substrate comprises a transparent substrate and a color filter formed thereon, wherein it further comprises the foregoing black matrix formed thereon; and a liquid crystal display device comprises an array substrate provided thereon with display electrodes and switching elements, a color filter substrate, common electrodes and a liquid crystal injected in the space between the array substrate and the color filter substrate, wherein it further comprises the foregoing black matrix formed on the switching elements or on the color filter substrate. The black matrix shows desired shading properties without impairing the quality of driving elements even when it is directly formed thereon. Moreover, the surface area of the black matrix can be minimized and the opening of the picture elements can be increased.

12 Claims, 2 Drawing Sheets

LIGHT SENSITIVE COMPOSITION FOR BLACK MATRIX, SUBSTRATE FOR COLOR FILTER, AND LIQUID CRYSTAL DISPLAY

BACKGROUND OF THE INVENTION

The present invention relates to a light-sensitive composition for forming a black matrix which is used as a means for shading in a liquid crystal display device, a black matrix produced from the composition and a color filter substrate carrying such a black matrix as well as a liquid crystal display device in which the foregoing black matrix is incorporated.

The liquid crystal color display device comprises a color filter substrate which comprises a glass substrate and red (R), green (G) and blue (B) picture elements regularly arranged on the substrate and thus can display color images thereon. In general, the color filter further comprises a shade pattern called black matrix which is arranged such that it fills up the spaces formed between picture elements to thus improve the contrast ratio of displayed images to the background.

The black matrix is formed from a material such as a metal or metal oxide film or a resin film comprising a pigment and the patterning thereof is carried out by the photolithography technique. For instance, Japanese Un-examined Patent Publication (hereunder referred to as "J.P. KOKAI") No. Sho 63-309916 discloses a method for forming a black matrix comprising applying a light-sensitive resin solution containing a pigment dispersed therein onto a transparent substrate, exposing the coated layer to light rays and then developing the exposed light-sensitive resin layer.

In addition, J.P. KOKAI No. Hei 1-152449 discloses a method for forming a black matrix and picture elements of a color filter on a single substrate. More specifically, the method comprises the steps of first applying, onto the surface of a glass substrate, a pigment dispersion comprising a photopolymerizable light-sensitive composition and carbon black, exposing to light and developing the exposed coated layer to form a black matrix pattern and then repeating procedures for patterning the surface of a coated layer similar to those used above to form a color filter comprising R, G and B picture elements in such a manner that these picture elements and the openings of the black matrix overlap one another.

However, the black matrix of the resin film containing the pigment suffers from a problem in that the liquid crystal display device is incompletely operated due to a decrease in the specific resistance of a liquid crystal and corresponding insufficient charge-retention of the liquid crystal layer (or molecules), as compared with the black matrix formed from a metal oxide film such as chromium oxide film.

J.P. KOKAI No. Hei 2-166422 discloses a liquid crystal display device comprising a plurality of transparent picture element-electrodes formed on a transparent substrate and a black matrix formed thereon so as to fill up the spaces remaining between the picture element-electrodes. In this system, the color filter and the black matrix are separately formed on two discrete substrates opposed to one another. The black matrix is arranged on the surface of driving electrodes while coming in contact therewith and therefore, there is not observed any aberration of the position of the black matrix relative to those of the driving electrodes even if the angle of field of display is changed. For this reason, the surface area of the black matrix can be minimized and correspondingly, the opening of the picture elements is relatively high.

However, this system in which the black matrix is directly formed on an active device (such as thin film transistor) a driving circuit by applying a pigment dispersion onto the surface of the circuit often suffers from a problem of faulty operations of thin film transistors (TFT) or thin film diodes (TFD, also called MIM) serving as driving elements for the liquid crystal display device.

SUMMARY OF THE INVENTION

Accordingly, an object of the present invention is to provide a black matrix which does not impair the operations of TFT's or TFD's as driving elements formed on the surface of the substrate on the driving side of a liquid crystal display device even when the black matrix is formed on the TFT's or TFD's while coming in close contact therewith and which shows desired shading properties; a light-sensitive composition for forming such a black matrix; and a color filter substrate comprising the foregoing black matrix.

Another object of the present invention is to provide a liquid crystal display device which can eliminate any deterioration of the liquid crystal due to materials for forming the black matrix.

A still another object of the present invention is to provide a liquid crystal display device which can eliminate any quality deterioration of the driving elements such as TFT's due to materials for forming the black matrix.

The inventors of this invention have found out that the foregoing problems associated with the conventional techniques can effectively be solved by removing monovalent metallic cations included, as impurities, in pigments dispersed in a pigment dispersion used for forming a black matrix through washing and thus have completed the present invention.

According to an aspect of the present invention, there is provided a light-sensitive composition for forming a black matrix which comprises (a) a photopolymerizable unsaturated compound, (b) a photopolymerization initiator, (c) a binder and (d) a pigment, wherein the amount of monovalent metallic cations present in the pigment as impurities is not more than 5 ppm.

According to another aspect of the present invention, there is provided a black matrix formed from the foregoing black matrix-forming light-sensitive composition.

According to a third aspect of the present invention, there is provided a color filter substrate which comprises a transparent substrate and a color filter formed thereon, wherein it further comprises a black matrix of the foregoing light-sensitive composition, formed on the substrate.

According to a fourth aspect of the present invention, there is provided a liquid crystal display device which comprises an array substrate provided thereon with display electrodes and switching elements electrically connected to the display electrodes; a color filter substrate opposed to and spaced apart from the array substrate at a predetermined distance; common electrodes formed on the color filter substrate; and a liquid crystal injected in the space having the predetermined thickness and formed between the array substrate and the color filter substrate, wherein it comprises the foregoing black matrix on the switching elements or on the color filter substrate.

DESCRIPTION OF THE PREFERRED EMBODIMENTS

Figure 1:
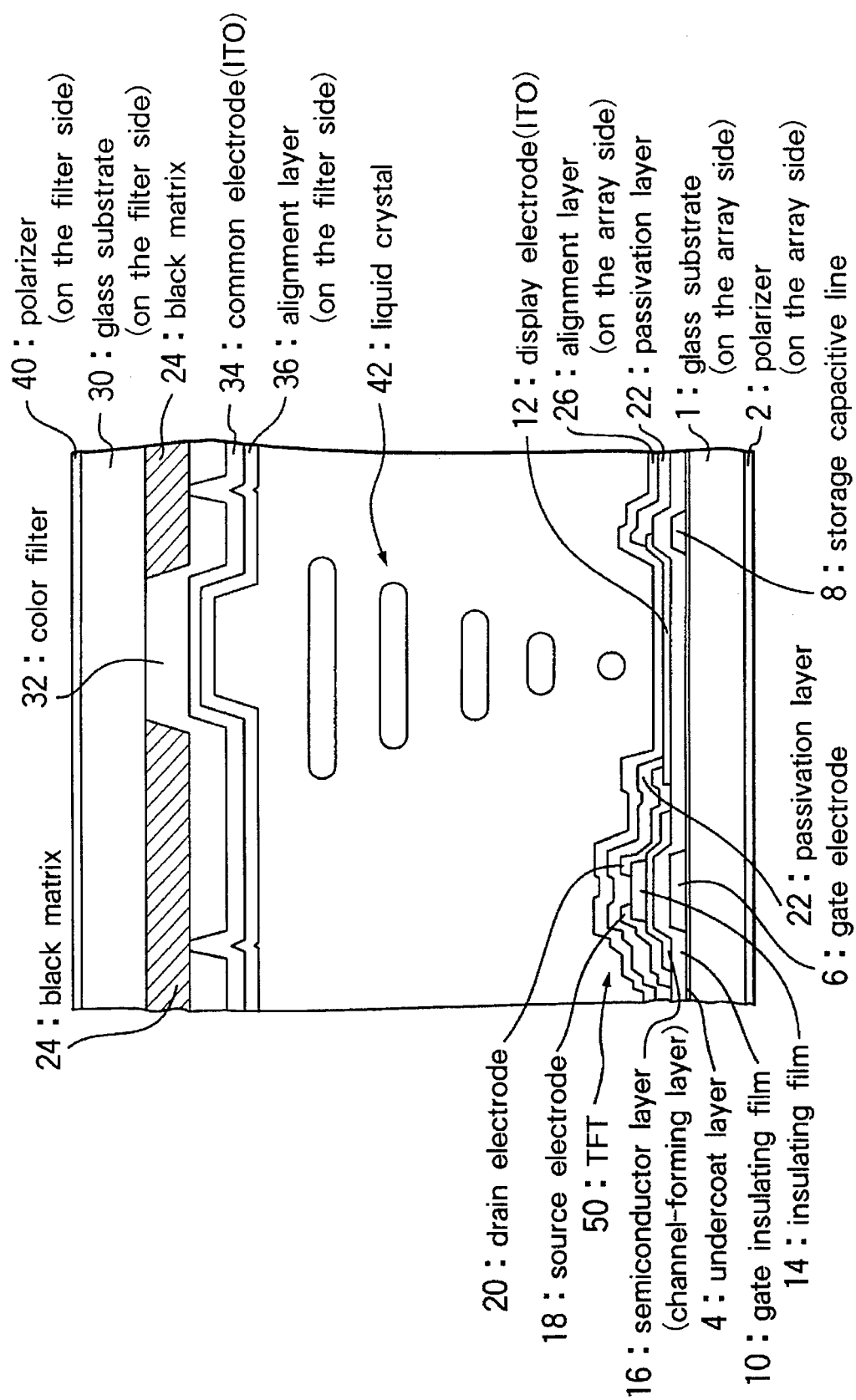
FIG. 1 is a cross sectional view of a cell of a liquid crystal display device according to a first embodiment of the present invention.

The present invention will hereunder be described in more detail.

The photopolymerizable unsaturated compound used in the invention as Component (a) is preferably a compound having at least one addition-polymerizable ethylenically unsaturated group and a boiling point, as determined at ordinary pressure, of not less than 100° C. Specific examples thereof are monofunctional (meth)acrylates such as polyethylene glycol mono(meth)acrylate, polypropylene glycol mono(meth)acrylate and phenoxyethyl (meth) acrylate; those obtained by adding ethylene oxide or propylene oxide to polyfunctional alcohols such as glycerin and trimethylolethane and then converted into (meth)acrylate derivatives such as polyethylene glycol di(meth)acrylate, trimethyloethane tri(meth)acrylate, neopentyl glycol (meth) acrylate, pentaerythritol tri(meth)acrylate, pentaerythritol tetra(meth)acrylate, dipentaerythritol hexa(meth)acrylate, hexanediol (meth)acrylate, trimethylolpropane tr i(acryloyloxypropyl) ether and tri(acryloyloxyethyl) isocyanulate; urethane acrylates such as those disclosed in Japanese Examined Patent Publication (hereunder referred to as "J.P. KOKOKU") Nos. Sho 48-41708 and Sho 50-6034 and J.P. KOKAI No. Sho 51-37193; and polyester acrylates such as those disclosed in J.P. KOKAI No. Sho 48-64183 and J.P. KOKOKU Nos. Sho 49-43191 and Sho 52-30490. Substances preferred as Component (a) further include, for instance, polyfunctional (meth) acrylates such as epoxy (meth)acrylates as the reaction products of epoxy resins with (meth)acrylic acids. Moreover, it is also possible to use those listed, as photohardenable monomers and oligomers, in Bulletin of Adhesive Society of Japan, Vol. 20, pp. 300–308.

The amount of Component (a) used in the light-sensitive composition suitably ranges from 5 to 50% by weight and preferably 10 to 40% by weight based on the weight of the solid content of the composition. The foregoing monomers or oligomers may be used alone or in combination.

The photopolymerization initiator used in the invention as Component (b) may be at least one kind of lophine dimer (triallyl imidazole dimer). In addition to the lophine dimer, the following substances may likewise be used alone or in combination. Such substances include, for instance, vicinal polyketoaldonyl compounds as disclosed in U.S. Pat. No. 2,367,660; α-carbonyl compounds as disclosed in U.S. Pat. Nos. 2,367,661 and 2,367,670; acyloin ethers as disclosed in U.S. Pat. No. 2,448,828; aromatic acyloin compounds substituted with α-hydrocarbon groups as disclosed in U.S. Pat. No. 2,722,512; polynuclear quinone compounds as disclosed in U.S. Pat. Nos. 3,046,127 and 2,951,758; a combination of triallyl imidazole dimers/p-aminophenyl ketone as disclosed in U.S. Pat. No. 3,549,367; benzothiazole compounds/trihalomethyl-s-triazine compounds as disclosed in J.P. KOKOKU No. Sho 51-48516; light-sensitive s-triazine compounds as disclosed in J.P. KOKAI No. Sho 63-153542; trihalomethyl-s-triazine compounds as disclosed in U.S. Pat. No. 4,239,850; and oxadiazole compounds as disclosed in U.S. Pat. No. 4,212,976.

The amount of the photopolymerization initiator used in the light-sensitive composition preferably ranges from about 0.2 to 20% by weight and more preferably 0.5 to 15% by weight based on the weight of the solid content of the composition.

The binder used in the invention as Component (c) is a linear organic polymer compatible with Component (a). Preferred are those soluble in an organic solvent and capable of being developed with a weak alkaline aqueous solution. Examples of such linear organic polymers are those having carboxyl groups on the side chains such as methacrylic acid copolymers, acrylic acid copolymers, itaconic acid copolymers, crotonic acid copolymers, maleic acid copolymers and partially esterified maleic acid copolymers as disclosed in, for instance, J.P. KOKAI Nos. Sho 59-44615, Sho 59-53836 and Sho 59-71048 and J.P. KOKOKU Nos. Sho 54-34327, Sho 58-12577 and Sho 54-25957; and acidic cellulose derivatives carrying carboxyl groups on the side chains.

Examples of binders useful in the invention further include polymers having hydroxyl groups to which acid anhydrides are added. Among these, particularly preferred are benzyl (meth)acrylate/(meth)acrylic acid copolymers and multi-component copolymers of benzyl (meth)acrylate/ (meth)acrylic acid/other monomers. Water-soluble polymers such as polyvinyl pyrrolidone, polyethylene oxide and polyvinyl alcohol are also useful in addition to the foregoing polymers. Moreover, alcohol-soluble polyamides and polyether of 2,2-bis-(4-hydroxyphenyl)propane and epichlorohydrin are useful for the improvement of the strength of the resulting hardened films. These polymers may be mixed with the foregoing Components in any amount, but preferably used in an amount ranging from 30 to 85% by weight based on the weight of the solid content of the light-sensitive composition. This is because the use of these polymers in an amount more than 90% by weight results in, for instance, formation of images having insufficient intensity.

Specific examples of the light-sensitive compositions comprising the foregoing Components (a) to (c) used in the present invention are those disclosed in, for instance, U.S. Pat. No. 3,549,367.

The pigment used in the present invention as Component (d) is not limited to specific ones. Examples of useful pigments which may be used alone or in combination for the formation of the black matrix include azo type, anthraquinone type, xanthene type, quinacridine type, indigo type, dioxazine type, indanthrone type and isoindolinone type pigments such as Phthalocyanine Blue (C.I. Pigment Blue 15:6 or C.I. Pigment Blue 15:3, e.g., Lionol Blue ES available from Toyo Ink Mfg. Co., Ltd. and Chromoblue A3R available from Ciba Geigy Corp.), Phthalocyanine Green (C.I. Pigment Green 7, 36 or C.I. Pigment Green 37, e.g., Lionol Green 2YS available from Toyo Ink Mfg. Co., Ltd.), perylene type pigments (C.I. Pigment Red 155) and anthraquinone type pigments (C.I. Pigment Red 177, e.g., Lionogen Red GD available from Toyo Ink Mfg. Co., Ltd. and Chromophthal Red BRN available from Ciba Geigy Corp.). Moreover, particularly preferred for color correction are C.I. Pigment Yellow 83, C.I. Pigment Yellow 154 such as Lionogen Yellow 3G available from Toyo Ink Mfg. Co., Ltd., C.I. Pigment Violet 23 such as Lionogen Violet RL available from Toyo Ink Mfg. Co., Ltd. and carbon black such as MA-100 available from Mitsubishi Chemical Industries Ltd. In addition, useful pigments further include, for instance, Aniline Black, Perylene Black and Titan Black.

The amount of the pigment used in the light-sensitive layer preferably ranges from 5 to 90% by weight and more preferably 10 to 60% by weight based on the solid content of the light-sensitive layer.

Each commercially available pigment generally comprises monovalent metallic cations as impurities in an amount of several hundreds to several tens of ppm. In the present invention, it is intended to use a pigment whose content of monovalent metallic cations as impurities present therein is reduced to a level of not more than 5 ppm through washing.

Incidentally, the pigment is commonly handled in the form of powder and the monovalent metallic cations are generally present therein in the form of salts easily soluble in water. For this reason, they can be removed to some extent through water-washing. However, the metal salts incorporated into aggregates of pigment particles cannot easily be washed away. For this reason, it is effective to remove the monovalent metal salts included in the pigment as impurities by, for instance, methods comprising washing the pigment while crushing the aggregates of pigment particles in water such as a method which makes use of an emulsifier or a dispersing device, a method comprising washing while applying ultrasonics, a method comprising washing in the presence of a swelling agent such as a surfactant or a lower alcohol or a combination thereof.

Alternatively, the pigment is sometimes handled in the state prior to drying (currently called wet cake). The water-washing of the wet cake permits effective removal of the monovalent metal salts as compared with the water-washing of the pigment powder (i.e., dried pigment). In any case, the washing is preferably performed while reducing the particle size of the pigment till the rate of pigment particles having a particle size of not more than 1μ preferably reaches on the order of not less than 10% by weight.

Moreover, the monovalent metallic cations may partially form salts insoluble in water. Therefore, it is preferred to wash the pigment with an acid in advance. Thus, the monovalent metallic cation-removing effect can further be improved. Examples of acids include organic acids such as acetic acid, oxalic acid and citric acid; and inorganic acids such as hydrochloric acid, sulfuric acid and nitric acid. These acids may be used in any concentration, but preferably used in an amount ranging from about 0.1 to 10% by weight. In addition, the reduction of the particle size of the pigment and the washing thereof with an acid can be simultaneously carried out and this results in an effective removal of the monovalent metallic cations as compared with the monovalent metallic cation-removal effect expected when these operations are separately carried out. Water used in the washing is preferably free of monovalent metallic cations and it is needless to say that water having a low content of impurities such as deionized water and distilled water are preferred, with deionized water being most preferred from the economical standpoint.

The light-sensitive composition of the present invention for forming a black matrix can be prepared by simultaneously or separately dissolving or dispersing the foregoing Components (a) to (d) in an appropriate solvent. Examples of solvent usable herein are 3-alkoxypropionic acid esters such as methyl 3-methoxypropionate, ethyl 3-methoxypropionate, methyl 3-ethoxypropionate and ethyl 3-ethoxypropionate; ketones such as methyl ethyl ketone, cyclohexanone and methyl cyclohexanone; propylene glycol monoalkyl ethers such as propylene glycol monomethyl ether, propylene glycol monoethyl ether and propylene glycol monopropyl ether; propylene glycol monoalkyl ether acetates such as propylene glycol monomethyl ether acetate, propylene glycol monoethyl ether acetate and propylene glycol monopropyl ether acetate; lactic acid esters such as methyl lactate and ethyl lactate; γ-butyrolactone, N-methylpyrrolidone and dimethylsulfoxide.

The amount of the solid content present in the light-sensitive composition of the invention suitably ranges from 10 to 30% by weight from the viewpoint of coating properties and shelf life or storage stability.

The black matrix-forming light-sensitive composition of the present invention may further comprise various additives in addition to the foregoing principal components. For instance, the addition of a surfactant permits the formation of a coated film showing more improved uniformity. Preferred examples of such surfactants include organopolysiloxane compounds and fluorine arom-containing surfactants such as those disclosed in J.P. KOKAI NO. Hei 2-804. The amount of the surfactant to be added to the light-sensitive composition is suitably in the range of from 0.001 to 0.5% by weight based on the weight of the solid content of the composition. In addition, an agent for inhibiting heat polymerization is generally added to the light-sensitive composition for the improvement of the storage stability thereof. Examples of useful heat polymerization-inhibiting agents are hydroquinone, p-methoxyphenol, di-t-butyl-p-cresol, p-cresol, pyrogallol, t-butylcatechol, benzoquinone, 4,4'-thiobis(3-methyl-6-t-butylphenol), 2,2'-methylene(4-methyl-6-t-butylphenol) and 2-mercaptobenzimidazole and it is desirable that the added amount thereof generally range from 500 to 2000 ppm with respect to the amount of Component (a), i.e., the photopolymerizable unsaturated compound. Incidentally, commercially available photopolymerizale unsaturated compounds usually comprise a proper amount of a heat polymerization-inhibiting agent.

The foregoing materials may always be contaminated with ions as impurities. Therefore, these materials to be used should always be carefully selected.

The dispersion of the pigment to the other components to give the light-sensitive composition of the present invention can be carried out using a dispersing device such as a roll mill, sand mill, ball mill or attritor. In this respect, special attention should be paid to prevent contamination of the composition with cations originated from the dispersing devices and/or containers for handling the ingredients therefor. The use of glass beads is inappropriate since they usually include sodium ions and would release them. Preferred are zirconia beads or glass beads free of sodium.

The black matrix of the present invention can be produced by the currently used photolithography technique. More specifically, the black matrix may be produced by applying an appropriate solution or dispersion of the light-sensitive composition of the present invention onto a proper substrate or the like, exposing the coated layer to light through a photomask carrying a desired pattern and then developing the exposed layer with a proper developer.

The present invention will hereunder be described in more detail with reference to the following non-limitative Examples and the effects practically accomplished by the present invention will also be discussed in detail in comparison with Comparative Examples.

Washing of Pigment

Various kinds of pigments were washed under the following conditions and the amounts of Na and K present therein before and after the washing operation were determined. The results thus obtained are summarized in the following Table 1.

TABLE 1

| Test No. | Conditions for Washing | Purple Na | Purple K | Yellow Na | Yellow K | Blue Na | Blue K |
|---|---|---|---|---|---|---|---|
| 1 | Water-Washing | 175 | <1 | 210 | <1 | 301 | <1 |
| 2 | Acetic Acid-Washing | 62 | <1 | 78 | <1 | 109 | <1 |
| 3 | Hydrochloric Acid-Washing | 60 | <1 | 79 | <1 | 102 | <1 |
| 4 | IPA + Acetic Acid*[1] | 40 | <1 | 50 | <1 | 70 | <1 |
| 5 | Ball Mill + Acetic Acid | 3 | <1 | 5 | <1 | 4 | <1 |
| 6 | Beads Mill + Acetic Acid | 2 | <1 | 4 | <1 | 2 | <1 |
| 7 | Wet Cake*[2] | 1 | <1 | | | | |
| 8 | Unwashed Pigment*[3] | 190 | <1 | 233 | <1 | 354 | <1 |

*[1] IPA: isopropyl alcohol
*[2] The Na ion content of the pigment obtained by drying a wet cake thereof was found to be 45 ppm.
*[3] Commercially available pigments of the following type:
Purple: C.I. Pigment Violet 23
Yellow: C.I. Pigment Yellow 139
Blue: C.I. Pigment Blue 15:3

Washing Conditions

Water-Washing:

Amount of pigment: 5 g

Deionized water (DIW): 150 g

Temperature: room temperature

Stirring Time: 2 hours

Each pigment was introduced into a polyethylene beaker containing 150 g of DIW, stirred by a magnetic stirrer and then filtered through centrifugation.

Acetic Acid-Washing:

Amount of pigment: 5 g

Acetic Acid: 1 g

DIW: 150 g

Temperature: room temperature

Stirring Time: 2 hours

Each pigment was introduced into a polyethylene beaker containing 150 g of DIW and 1 g of acetic acid, stirred by a magnetic stirrer and then filtered through centrifugation. The cake thus formed through the filtration was dispersed in and washed with 150 g of DIW, again filtered through centrifugation and then dried.

IPA+Acetic Acid-Washing:

Amount of pigment: 5 g

Acetic Acid: 1 g

IPA: 150 g

Temperature: room temperature

Stirring Time: 2 hours

Each pigment was introduced into a polyethylene beaker containing 150 g of IPA and 1 g of acetic acid, stirred by a magnetic stirrer and then filtered through centrifugation. The cake thus formed through the filtration was dispersed in and washed with 150 g of DIW, again filtered through centrifugation and then dried.

Ball Mill+Acetic Acid-Washing:

Amount of pigment: 20 g

Acetic Acid: 2 g

DIW: 180 g

Each pigment was introduced into a stainless steel container, dispersed in 180 g of DIW containing 2 g of acetic acid over 10 hours, followed by addition of 300 g of additional DIW and dispersion for 10 minutes. After filtration through centrifugation, the pigment was sufficiently washed by adding to 1000 g of DIW, again filtered through centrifugation and dried.

Beads Mill+Acetic Acid-Washing:

Amount of pigment: 20 g

Acetic Acid: 2 g

DIW: 180 g

Each pigment was introduced into a stainless steel container, followed by addition of zirconia beads, dispersion in 180 g of DIW containing 2 g of acetic acid over 5 hours, addition of 300 g of additional DIW and dispersion for additional 10 minutes. After filtration through centrifugation, the pigment was sufficiently washed by adding to 1000 g of DIW, again filtered through centrifugation and dried.

Wet Cake-Washing:

Amount of pigment: 10 g

Acetic Acid: 1 g

DIW: 150 g

Temperature: room temperature

Stirring Time: 2 hours

The wet cake of each pigment was introduced into a polyethylene beaker containing 150 g of DIW and 1 g of acetic acid, stirred by a magnetic stirrer and then filtered through centrifugation. The cake thus formed through the filtration was dispersed in and washed with 150 g of additional DIW, again filtered through centrifugation and then dried.

EXAMPLE 1 AND COMPARATIVE EXAMPLE 1

The structure of a liquid crystal display device produced in this Example will be explained in detail below while referring to FIG. 1. FIG. 1 is a cross sectional view of the cell of the liquid crystal display device produced in this Example.

TFT's (thin film transistor) 50 serving as switching elements are fabricated on a glass substrate 1 serving as an array substrate. An undercoat layer 4 is formed on the glass substrate 1 for preventing any dissolution of alkali ions from the substrate. The gate electrode 6 and storage-capacitive line 8 of TFT's 50 are formed on the undercoat layer 4 and an insulating layer serving as a gate insulating film 10 is formed on the surface of these elements. A semiconductor layer 16, which acts as channel regions of TFT's 50, is formed on the gate electrode 6 through the gate insulating film 10. There are formed an insulating film 14 on the semiconductor layer 16, and a source electrode 18 and a drain electrode 20 on the semiconductor layer 16 on both sides of the insulating film 14, respectively. One end of the drain electrode 20 is connected to an end of a display electrode 12 which forms a display region, extends over the storage-capacitive line 8 and is formed from, for instance, ITO. The display region constituted by the display electrode 12 is, in fact, considerably wider than that of TFT 50, but is depicted as a narrow region on FIG. 1 as a matter of convenience. A passivation layer 22 is formed on the region of the display electrode 12 other than the display region.

A passivation layer 22 was formed on TFT 50 and the storage-capacitive line 8. An alignment layer 26 for orientating liquid crystal molecules was formed on the passivation layer 22 and the display electrode 12. A polarizer 2 was disposed on the back face of the glass substrate 1.

A glass substrate 30 serving as a color filter substrate is arranged at a position opposed to the glass substrate 1 so as to form a space having a predetermined thickness between the display electrode 12 and a common electrode 34, which is filled with a layer of a liquid crystal 42. There are formed, on the surface of the glass substrate 30, a black matrix 24 to which a shade function is imparted and a color filter 32 composed of three primary colors, i.e., R (red), G (green) and B (blue).

The liquid crystal display device of this Example can be produced by the conventional production method except for the production of the black matrix 24. The method for producing the liquid crystal display device of this Example will hereunder be explained while focusing on the method for forming the black matrix.

The following light-sensitive composition [Formulation 1 (Comparative Example 1) or Formulation 2 (Example 1)] was applied onto a glass substrate 30 so that the resulting film had a thickness (as determined after drying) of 2 μm and then dried with heating at 85° C. for 3 minutes. Moreover, a 10% by weight aqueous solution of polyvinyl alcohol (PVA) was applied onto the foregoing film so that the resulting film had a thickness (as determined after drying) of 1.0 μm and then dried with heating at 85° C. for 3 minutes to give a PVA film serving as an oxygen barrier. The light-sensitive layer was exposed to ultraviolet rays (100 mJ/cm$^2$) through a desired photomask and then developed with the following developer to form a black matrix 24 on the glass substrate 30.

Thereafter, a color filter 32 and a common electrode 34 were formed on the glass substrate 30 on which the black matrix 24 had been formed, followed by binding it with a glass substrate 1 on which TFT's had been formed in such a manner that a space having a predetermined thickness was formed therebetween, then injection of a twisted nematic liquid crystal 42 and sealing the assembly to thus complete a liquid crystal display device.

Formulation of Developer:
  1% Aqueous solution of sodium carbonate
Conditions for Development:
  room temperature, for 60 sec.

| Formulation 1 of Light-Sensitive Composition (Comp. Ex. 1) | |
|---|---|
| benzyl methacrylate/methacrylic acid copolymer (binder) (molar ratio: 70/30; weight-average molecular weight: 20,000) | 62 g |
| pentaerythritol tetraacrylate (monomer) | 38 g |
| 4-[p-N,N-di(ethoxycarbonylmethyl)]-2,6-di(trichloromethyl)-s-triazine (photopolymerization initiator) | 1.5 g |
| C.I. Pigment Blue [15:3] (Pigment: unwashed) | 13 g |
| C.I. Pigment Violet [23] (Pigment: unwashed) | 33 g |
| C.I. Pigment Yellow [139] (Pigment: unwashed) | 14 g |
| hydroquinone monomethyl ether (heat polymerization-inhibiting agent) | 0.01 g |
| ethyl 3-ethoxypropionate (solvent) | 650 g |

The sodium ion contents of the commercially available pigments (unwashed pigments) used in the foregoing Formulation 1 are as follows:

| C.I. Pigment Blue [15:3] | 354 ppm |
|---|---|
| C.I. Pigment Violet [23] | 190 ppm |
| C.I. Pigment Yellow [139] | 233 ppm |

The sodium ion content of the foregoing Formulation 1 except for the pigments was found to be 0.1 ppm and that of Formulation 1 was found to be 88 ppm.

Formulation 2 of Light-Sensitive Composition (Ex. 1)

This Formulation 2 was identical to Formulation 1 except that the pigments were washed according to the foregoing Washing Test No. 5. The sodium ion content of Formulation 2 was found to be 1 ppm.

The liquid crystal display device was inspected for the reliability by a high temperature-operation test. As a result, the device of Comparative Example 1 which comprised the unwashed pigments caused incomplete operation due to insufficient charge-retention of the liquid crystal layer (or molecules) after 3,000 hours at 70° C. and after 6,000 hours at 50° C. The device (Comp. Ex. 1) was analyzed and it was found that the liquid crystal thereof had a specific resistance two orders in magnitude smaller than the original value. Moreover, the incomplete portion thereof was analyzed by the secondary ion mass spectrometry (SIMS) and as a result, it was found that sodium was detected at the boundary between the incomplete portion of the liquid crystal and alignment layer, while sodium was not detected in the liquid crystal display device comprising the combination of a glass substrate free of any black matrix 24 with the color filter substrate.

On the other hand, the liquid crystal display device of Example 1 which made use of Formulation 2 comprising the washed pigments never caused any incomplete operation even when the stress-applying time exceeded 8,000 hours at both 50° C. and 70° C. and in the SIMS analysis, sodium was not detected in the TFT's.

The foregoing results clearly indicate that the black matrix of the present invention comprising pigments whose content of monovalent metallic ions present as impurities is limited to a level of not more than 5 ppm substantially improves the quality of the active matrix type TFT liquid crystal display device.

EXAMPLE 2 AND COMPARATIVE EXAMPLE 2

Figure 2:
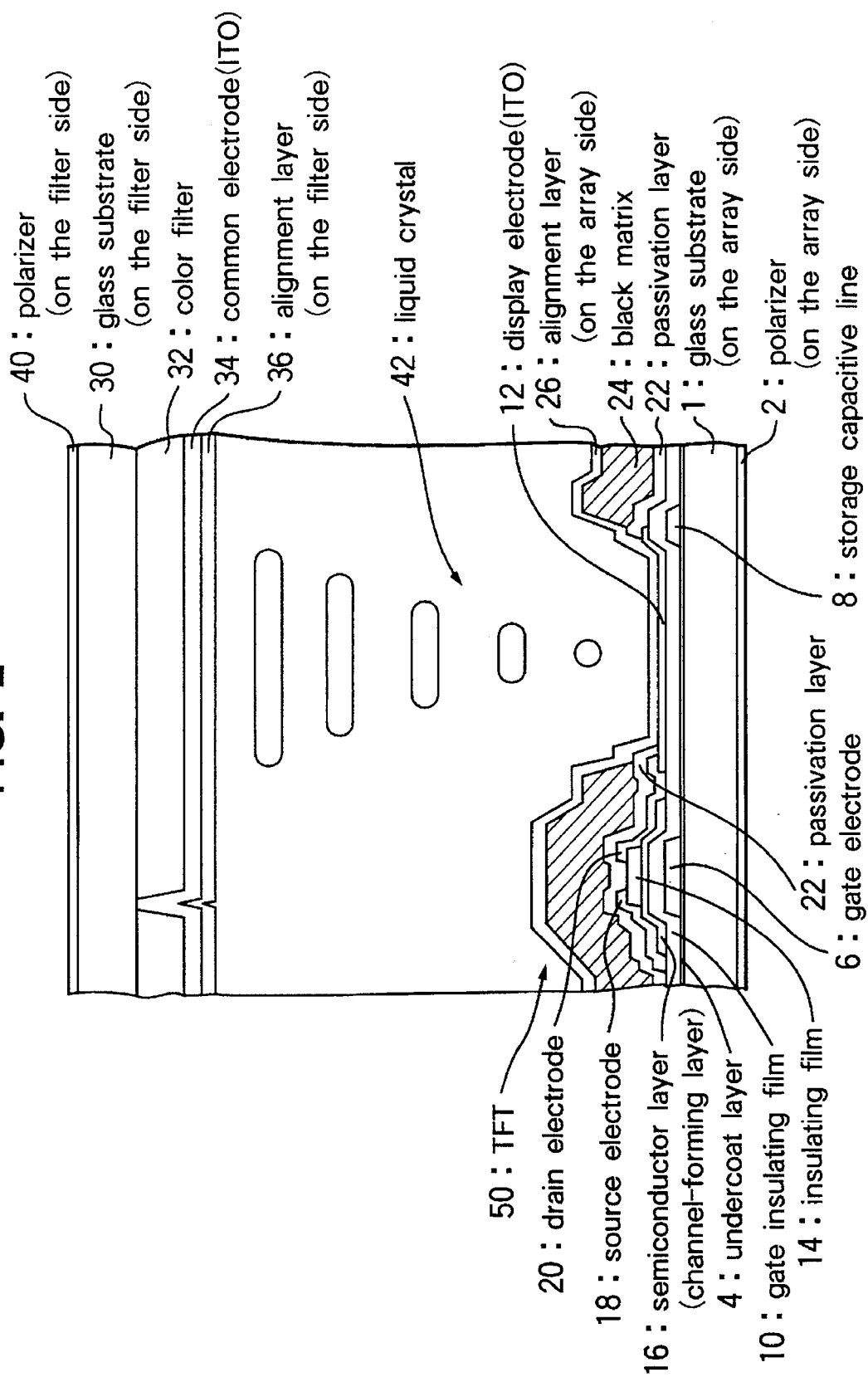
FIG. 2 is a cross sectional view of a cell of a liquid crystal display device according to a second embodiment of the present invention.

The structure of a liquid crystal display device produced in this Example will be explained in detail below while referring to FIG. 2. FIG. 2 is a cross sectional view of the cell of the liquid crystal display device produced in this Example.

TFT's (thin film transistor) 50 serving as a switching elements are fabricated on a glass substrate 1 serving as an array substrate. An undercoat layer 4 is formed on the glass substrate 1 for preventing the dissolution of alkali ions from the substrate. The gate electrode 6 and storage-capacitive line 8 of TFT 50 are formed on the undercoat layer 4 and an insulating layer serving as a gate insulating film 10 is formed on the surface of these elements. A semiconductor layer 16, which forms the channel region of TFT 50, is formed on the gate electrode 6 through the gate insulating film 10. There are formed an insulating film 14 on the semiconductor layer 16, and a source electrode 18 and a drain electrode 20 on the semiconductor layer 16 on both sides of the insulating film 14, respectively. One end of the drain electrode 20 is connected to an end of a display electrode 12 which forms a display region, extends over the storage-capacitive line 8 and is formed from, for instance, ITO. The display region constituted by the display electrode 12 is, in fact, considerably wider than that of TFT 50, but is depicted as a narrow region on FIG. 2 as a matter of convenience. A passivation layer 22 is formed on the region of the display electrode 12 other than the display region.

A black matrix 24 is formed on TFT 50 and the storage-capacitive line 8. An alignment layer 26 for orientating liquid crystal molecules is formed on the black matrix 24 and the display electrode 12. A polarizer 2 is disposed on the back face of the glass substrate 1.

A glass substrate 30 serving as a color filter substrate is arranged at a position opposed to the glass substrate 1 so as to form a space having a predetermined thickness between the display electrode 12 and a common electrode 34, which is filled with a layer of a liquid crystal 42. There is formed, on the surface of the glass substrate 30, a color filter 32 composed of picture elements of three primary colors, i.e., R (red), G (green) and B (blue). The color filter 32 is formed in such a manner that every picture elements of three primary colors are formed in the area on the color filter substrate opposed to each display electrode 12.

A common electrode 34 of, for instance, ITO is formed on the color filter 32 and an alignment layer 36 is formed on the common electrode 34. A polarizer 40 is formed on the back face of the glass substrate 30. A liquid crystal 42 is injected in the space formed between the alignment layers 26 and 36.

The liquid crystal display device of this Example can be produced by the conventional production method except for the production of the black matrix 24. The method for producing the liquid crystal display device of this Example will hereunder be explained in detail while focusing on the method for forming the black matrix.

TFT 50 was formed, through the photolithography technique, on a glass substrate 1 on which an undecoat layer 4 ($SiO_x$, for instance, $SiO_2$) for preventing dissolution of alkali ions from the substrate 1. The light-sensitive composition used in Example 1 and Comparative Example 1 [Formulation 1 (Comparative Example 2) or Formulation 2 (Example 2)] was applied onto TFT 50 so that the resulting film had a thickness (as determined after drying) of 2 μm and then dried with heating at 85° C. for 3 minutes. Moreover, a 10% by weight aqueous solution of polyvinyl alcohol (PVA) was applied onto the foregoing film so that the resulting film had a thickness (as determined after drying) of 1.0 μm and then dried with heating at 85° C. for 3 minutes to give a PVA film serving as an oxygen barrier. The light-sensitive layer was exposed to ultraviolet rays (100 $mJ/cm^2$) through a desired photomask and then developed with the developer used in Example 1 and Comparative Example 1 to form a black matrix 24 on TFT 50. Thereafter, the glass substrate 1 on which the black matrix 24 had been formed, was combined with a glass substrate 30 on the color filter 32 side, the resulting assembly was sealed in such a manner that a space having a predetermined thickness was formed therebetween, then a twisted nematic liquid crystal 42 was injected into the space and sealed to thus complete a liquid crystal display device.

The liquid crystal display device was inspected for the reliability by a high temperature-operation test. As a result, the device of Comparative Example 2 which comprised the unwashed pigments caused incomplete operation due to insufficient charging ability of TFT after 2,000 hours at 70° C. and after 4,000 hours at 50° C. The defective portion of the device was analyzed by the secondary ion mass spectrometry (SIMS) and as a result, it was found that sodium was detected at the TFT portions of defective picture elements, while sodium was not detected in the normal TFT's.

On the other hand, the liquid crystal display device of Example 2 which made use of Formulation 2 comprising the washed pigments never caused any incomplete operation even when the stress-applying time exceeded 5,000 hours at both 50° and 70° C. and in the SIMS analysis, sodium was not detected at all in the TFT's.

The foregoing results clearly indicate that the black matrix of the present invention comprising pigments whose content of monovalent metallic ions present as impurities is limited to a level of not more than 5 ppm substantially improves the quality of the active matrix type TFT liquid crystal display device.

The black matrix of the present invention does not impair the operations of TFT's or TFD's as driving elements formed on the surface of the substrate on the driving side of a liquid crystal display device and shows desired shading properties even when the black matrix is formed on the TFT's or TFD's while coming in close contact therewith. For this reason, the black matrix of a liquid crystal display device can directly be formed on the surface of a driving circuit with a high accuracy of alignment and therefore, there is not any aberration of positions between the driving electrodes and the black matrix. Accordingly, the surface area of the black matrix can be minimized and the opening rate of the picture elements is correspondingly increased.

What is claimed is:

1. A light-sensitive composition for forming a black matrix which comprises (a) a photopolymerizable unsaturated compound, (b) a photopolymerization initiator, (c) a binder and (d) a pigment, wherein the amount of monovalent metallic cations present in the pigment as impurities is 5 ppm or less.

2. The light-sensitive composition of claim 1 wherein the pigment is a washed pigment selected from the group consisting of a pigment (a) washed while reducing the particle size until the rate of pigment particles having a particle size of 1μ or less reaches about 10% or greater by weight; (b) washed in an emulsifier or a dispersing device; (c) washed while applying ultrasonics; and (d) washed in the presence of a swelling agent.

3. The light-sensitive composition of claim 2 wherein the pigment is treated with an acid prior to the washing.

4. The light-sensitive composition of claim 1 wherein the pigment is obtained by washing the wet cake thereof.

5. The light-sensitive composition of claim 1 wherein the amount of the photopolymerizable unsaturated compound ranges from 10 to 40% by weight based on the solid content weight of the composition.

6. The light-sensitive composition of claim 1 wherein the amount of the photopolymerization initiator ranges from 0.5 to 15% by weight based on the solid content weight of the composition.

7. The light-sensitive composition of claim 1 wherein the amount of the binder ranges from 30 to 85% by weight based on the solid content weight of the composition.

8. The light-sensitive composition of claim 1 wherein the amount of the pigment ranges from 10 to 60% by weight based on the solid content weight of the composition.

9. A black matrix prepared from a light-sensitive composition which comprises (a) a photopolymerizable unsaturated compound, (b) a photopolymerization initiator, (c) a binder and (d) a pigment, wherein the amount of monovalent metallic cations present in the pigment as impurities is 5 ppm or less.

10. A color filter substrate which comprises a transparent substrate and a color filter formed on the substrate, further comprising a black matrix formed on the substrate and prepared from a light-sensitive composition which comprises (a) a photopolymerizable unsaturated compound, (b) a photopolymerization initiator, (c) a binder and (d) a pigment, wherein the amount of monovalent metallic cations present in the pigment as impurities is 5 ppm or less.

11. A liquid crystal display device which comprises
    an array substrate on which are provided display electrodes and switching elements electrically connected to the display electrodes;

a color filter substrate opposed to and spaced apart from the array substrate at a predetermined distance;

common electrodes formed on the color filter substrate; and a liquid crystal injected in the space having the predetermined distance, formed between the array substrate and the color filter substrate, wherein the display comprises a black matrix formed on the switching elements, which is prepared from a light-sensitive composition which comprises (a) a photopolymerizable unsaturated compound, (b) a photopolymerization initiator, (c) a binder and (d) a pigment, wherein the amount of monovalent metallic cations present in the pigment as impurities is 5 ppm or less.

12. A liquid crystal display device which comprises an array substrate on which are provided display electrodes and switching elements electrically connected to the display electrodes;

a color filter substrate opposed to and spaced apart from the array substrate at a predetermined distance;

common electrodes formed on the color filter substrate; and a liquid crystal injected in the space having the predetermined distance, formed between the array substrate and the color filter substrate, wherein the display comprises a black matrix formed on the color filter substrate, which is prepared from a light-sensitive composition which comprises (a) a photopolymerizable unsaturated compound, (b) a photopolymerization initiator, (c) a binder and (d) a pigment, wherein the amount of monovalent metallic cations present in the pigment as impurities is 5 ppm or less.

* * * * *